(12) United States Patent
Perera et al.

(10) Patent No.: US 11,960,202 B1
(45) Date of Patent: Apr. 16, 2024

(54) EUV MASK DEFECT TOOL APPARATUS

(71) Applicant: EUV TECH, INC., Martinez, CA (US)

(72) Inventors: Chami N Perera, Martinez, CA (US); David C. Houser, Martinez, CA (US); Charles G. Murray, Martinez, CA (US); Alexander N. Khodarev, Martinez, CA (US); Travis W. Grodt, Martinez, CA (US)

(73) Assignee: EUV TECH, INC., Martinez, CA (US)

( * ) Notice: Subject to any disclaimer, the term of this patent is extended or adjusted under 35 U.S.C. 154(b) by 371 days.

(21) Appl. No.: 17/503,071

(22) Filed: Oct. 15, 2021

(51) Int. Cl.
*G03F 1/84* (2012.01)
*G01N 21/956* (2006.01)
*G03F 7/00* (2006.01)

(52) U.S. Cl.
CPC .............. *G03F 1/84* (2013.01); *G01N 21/956* (2013.01); *G03F 7/7065* (2013.01); *G01N 2021/95676* (2013.01); *G01N 2201/061* (2013.01); *G01N 2201/068* (2013.01)

(58) Field of Classification Search
None
See application file for complete search history.

(56) References Cited

U.S. PATENT DOCUMENTS

| | | | | |
|---|---|---|---|---|
| 5,560,616 | A * | 10/1996 | Van Hessen | A63F 7/0076 |
| | | | | 273/450 |
| 6,864,490 | B1 * | 3/2005 | Underwood | G21K 1/06 |
| | | | | 250/461.1 |
| 2022/0167492 | A1 * | 5/2022 | Na | G21K 1/10 |

* cited by examiner

*Primary Examiner* — Edwin C Gunberg
(74) *Attorney, Agent, or Firm* — Polygon IP, LLP

(57) ABSTRACT

An EUV microscope device utilizing a source of a beam of EUV light. The light is sent to a collector which produces a first focused EUV beam. A monochromator receives the first focused EUV beam and produces a second EUV beam that is passed to an illumination module. The output of the illumination module is passed to a mask. The reflected beam from the mask is sent to a zone plate and a detector to produce an image.

10 Claims, 3 Drawing Sheets

EUV MASK DEFECT TOOL APPARATUS

CROSS-REFERENCES TO RELATED APPLICATIONS

The present application claims the benefit of U.S. Provisional Application 63/176,088, filed 16 Apr. 2021.

BACKGROUND OF THE INVENTION

The present application relates to a novel and useful EUV mask defect tool or EUV microscope, for use with lithography masks used to produce electronic chips.

Prior mask inspection devices have been proposed to assess the integrity of masks. For example, U.S. Pat. No. 6,738,135 depicts a novel system for inspecting lithography masks that are sometimes referred to as zoneplate microscopes.

It is realized that zoneplate microscopes are highly chromatic, having a wave length dependent focal length. If not controlled, this characteristic leads to poor resolution. Since chromatic effects are focal length dependent, the shorter the focal length of these devices, the less important chromatic effects become.

In U.S. Pat. No. 6,738,135, a sufficiently short focal length was achieved in order to handle the full typical bandwidth supported by Mo/Si multilayer optics. Although successful, certain drawbacks existed. Namely, the system working distance of this prior art device was severely constrained. Moreover, the corrective implementation of a zoneplate central stop to filter out zoneplate zero order flare may not be used, since at short working distances, the central stop of such zoneplate would occupy too large a fraction of the full light aperture to be viable.

An EUV microscope device for analyzing mask defects in an efficient manner would constitute a notable advance in the electronic arts.

SUMMARY OF THE INVENTION

In accordance with the present application, the above delineated problems are solved by using a monochromator which further narrows the bandwidth of the generated EUV beam and, thus, allows for a longer working distance.

The EUV mask defect tool apparatus includes as one of its elements a source of a beam or emanation of EUV light. Such emanation may originate with a laser produced plasma, a discharged produced plasma, and the like. The beam of EUV light is forwarded to a collector which produces a first focused EUV beam. The collector may be formed of a flat mirror in series with am aspherical mirror. The beam leaving the aspherical mirror serves as an intermediate focus to subsequent elements of the apparatus of the present application.

First focused EUV beam from the collector passes to a holographic optical element (HOE) which includes a monochromator incombination with entrance and exit pinholes. The monochromator is then used to purify the light to the level of λ/Δλ of 150 or better. Thus, the monochromator essentially combines the functionality of focusing and linear dispersion. The focusing function of the monochromator reimages the received EUV beam at the entrance pinhole and passes the same to the exit pinhole. Thus, a second EUV beam is generated by the monochromator.

The second EUV beam from the monochromator is sent to an illumination module or illuminator. Illumination module produces a reimaged EUV beam which is directed to the surface of the mask being analyzed.

The EUV light reflected from the mask passes through a zone plate. The zone plate may, optionally, include a central obscuration in order to employ first order light without overlap of zero order light. The light passing through the zone plate is sent to a detector such as a charge coupled device (CCD) which normally includes a screen where any defects on the surface of the mask may be viewed by the user.

Thus, a novel EUV mask defect tool is provided which features the use of an integrated monochromator and a zoneplate having a central stop to mitigate zero order flare.

It is therefore an object of the present application to provide a novel EUV mask defect tool that efficiently and economically is capable of inspecting EUV lithography masks.

Another object of the present application is to provide a novel EUV mask defect tool that allows inspection of EUV masks at a lower cost than inspection tools of the prior art.

Another object of the present application is to provide a novel EUV mask defect tool that includes a novel optical design having shorter track length and increased beam clearances that are lacking in comparable tools of the prior art.

Another object of the present application is to provide a novel EUV mask defect tool that eliminates chromatic effects found in prior zone plate microscopes.

Another object of the present application is to provide a novel EUV mask defect tool which employs a zone plate having a central stop, or obscuration, to filter out zone plate zero order flare.

Another object of the present application is to provide a novel EUV mask defect tool for inspecting EUV lithography masks which is capable of measuring such masks with a high degree of accuracy and repeatability.

Another object of the present application is to provide a novel EUV mask defect tool which is compatible with conventional mask blank transfer systems and is operational in standard clean rooms, typically used to manufacture semiconductor chips.

The invention possesses other objects and advantages especially as concerns particular characteristics and features thereof which will become apparent as the specification continues.

Reference is made to the following drawings, which further describe the application sought for patenting.

For a better understanding of the application, reference is made to the following detailed description of the preferred embodiments which should be referenced to the above described drawings.

DETAILED DESCRIPTION OF THE PREFERRED EMBODIMENTS

Various aspects of the present application will evolve from the following detailed description thereof which should be referenced to the prior delineated drawings.

Figure 1:
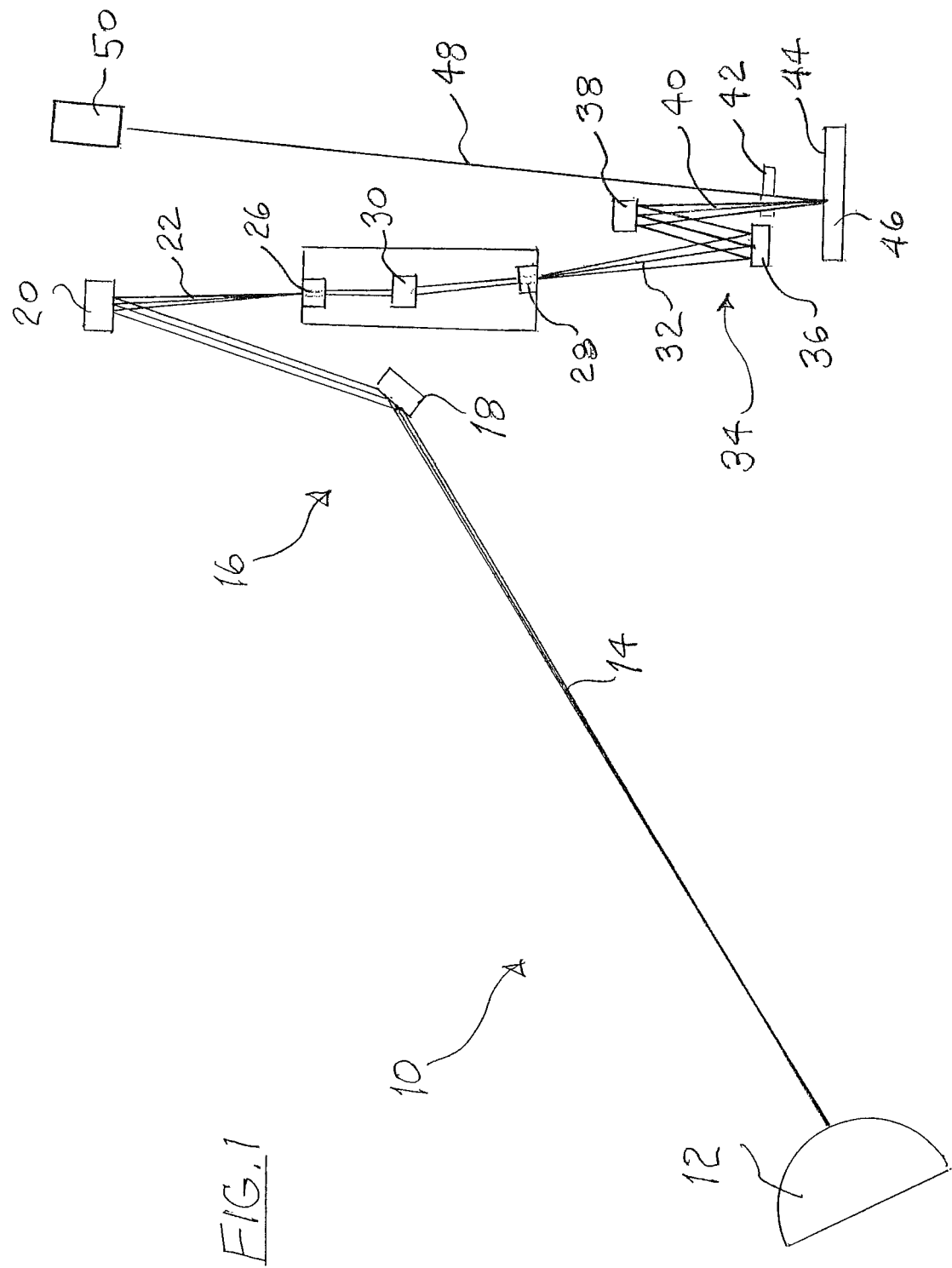
FIG. 1 is a schematic view depicting the elements of the present application.

With reference to FIG. 1, numerical character 10 is employed to depict the tool apparatus as a whole. Tool apparatus 10 includes as one of its elements an extreme ultraviolet (EUV) light source 12 which may be a laser produced plasma source. However, EUV light source 12 may also derive from a discharge produced plasma source and the like. The following table represents the optical specifications of tool apparatus 10:

TABLE I

| EUV wavelength | 13.5 nm |
| --- | --- |
| EUV source type | Incoherent |
| Illumination size | 10 μm |
| Focal length | 500 μm |
| Band width | 333 λ/Δλ |
| CCD50 IX pixel size | 8.7 nm |
| DDC50 real pixel size | 13 um |
| CCD50 pixels | 1025 |
| Target photons/pixel | 2000 |

Viewing FIG. 1, an EUV beam 14 from source 12 is sent to collector 16 which may take the form of a flat mirror 18 in series with an aspherical mirror 20. The resulting first focused EUV beam 22 from collector 16 is passed to a holographic optical element (HOE) 24, which includes an entrance pinhole 26 and exit pinhole 28 on either side of monochromator 30. Monochromator 30 performs the functions of focusing and linear dispersion, since monochromator 30 includes a grating. Again, monochromator 30, thus, performs a focusing function that is used to re-image EUV light from the entrance pinhole 26 to exit pinhole 28. In essence, monochromator 30 is used to purify the received light to a level of λ/Δλ of 150 or better. Monochromator 30 may take the form of any suitable device known in the art and is available from EUV Tech Inc. of Martinez, California, under part No. B151667. For example, monochromator 30 may externalize one having a single holographic element, 9 mm in diameter with an approximate 100 nm maximum feature size. A second EUV beam 32 passes from exit pinhole 28.

Figure 2:
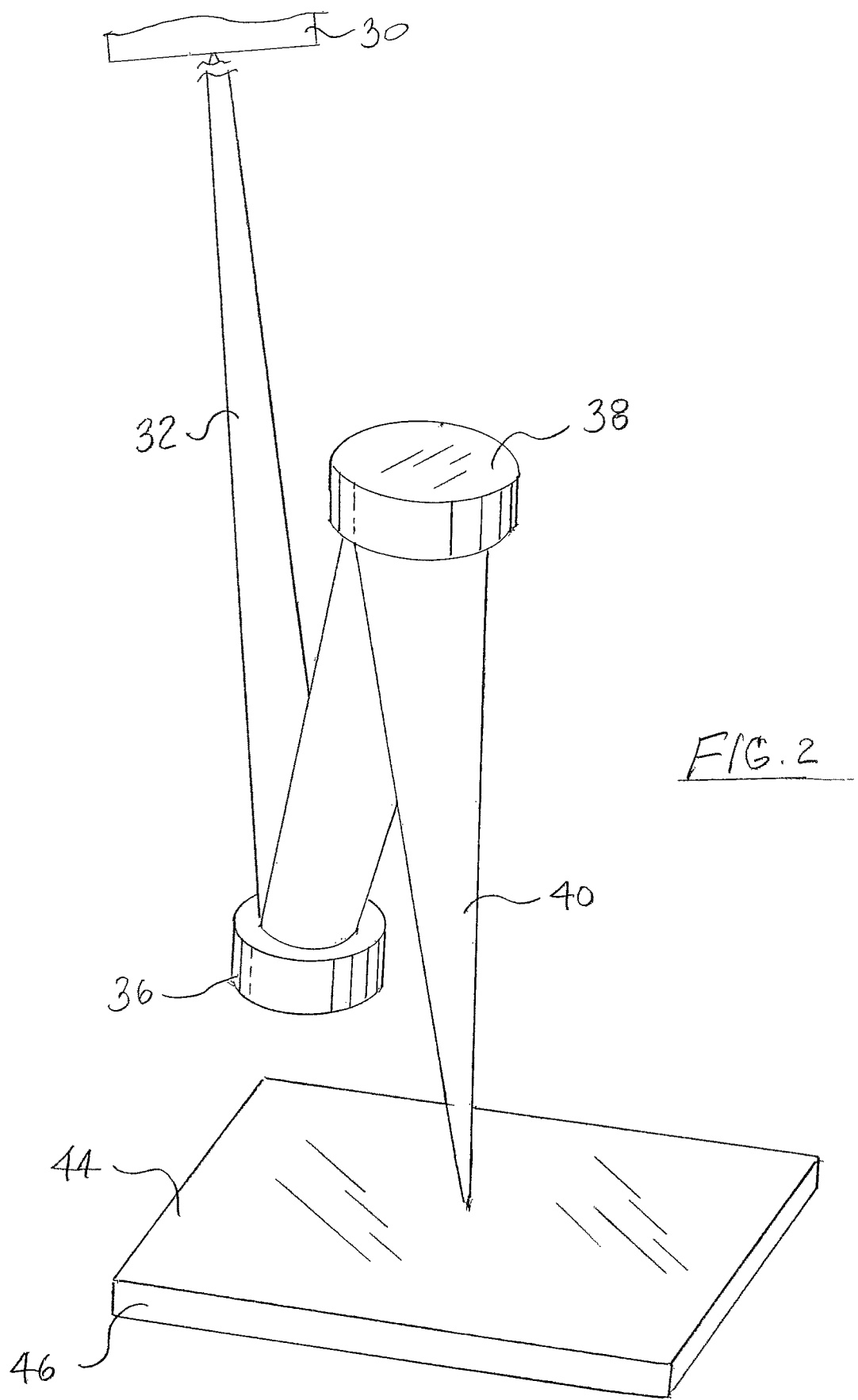
FIG. 2 is an isometric view showing the illumination module of the device of the present application.

Second EUV beam 32 travels to an illumination module (illuminator) 34, FIG. 2. The second EUV beam 32 is transformed from a broad spectrum (1 part in 50, 2%) to a narrower spectrum (1 part in 450, 0.2%) at illumination module 34. Illumination module 34 consists of the combination of a flat mirror 36 and an aspherical mirror 38 having a clear aperture of about 36 mm.

Figure 3:
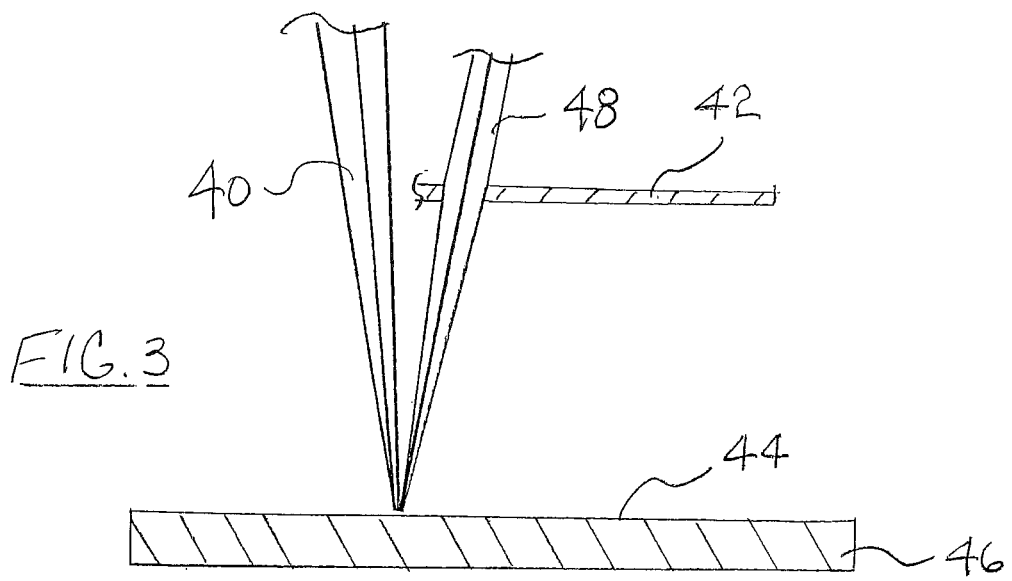
FIG. 3 is a schematic view showing the position of the zone plate relative to a mask in the device of the present application.
Figure 4:
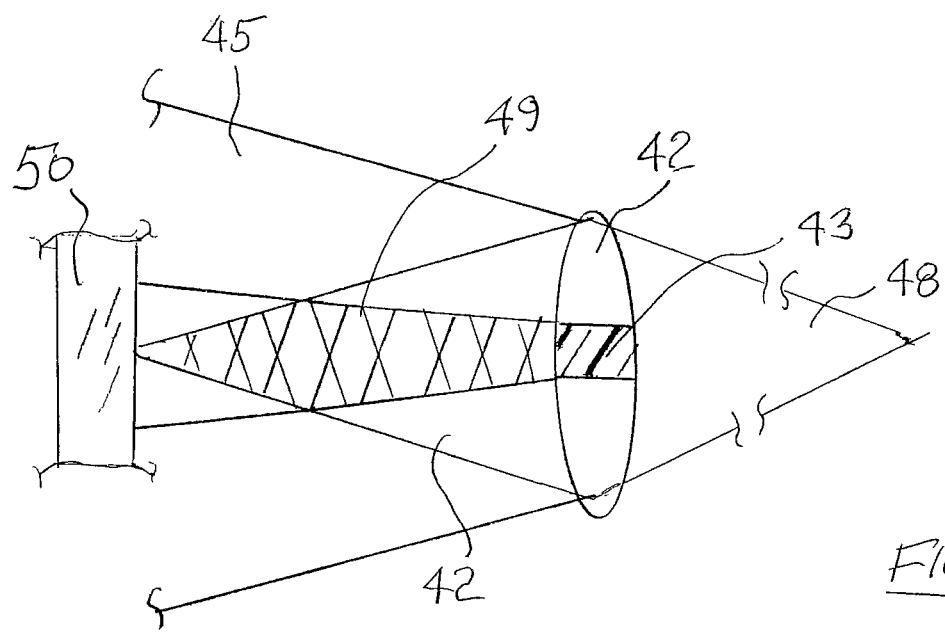
FIG. 4 is a schematic view illustrating the operation of the zone plate of the device of the present application.

The reimaged and two times demagnified beam 40 leaving aspherical mirror 38 of illumination module 34 passes through a zoneplate 42 and as a 10 μm width illumination on surface 44 of mask 46. FIG. 3 depicts the position of zone plate 42 relative to mask 46 and mask surface 44. Zone plate 42 is shown on FIG. 3 in its functional lens shape. Light beam 48, reflected from mask 46 and passing through zoneplate 42, is sent to an imaging sensor 50 which may be a vacuum cooled charge coupled device (CCD) camera, discussed in greater detail hereinafter. With reference to FIG. 4, zone plate 42 preferably includes a central obscuration 43 to prevent overlap of zero order light 45 and the diffracted first order light 47 of zone plate 42. Central obscuration 43 creates a shadow 49 between zone plate 42 and CCD It should be noted that the diffracted first order light 47 of zone plate 52 is the useful target imaging region of light beam 48 reflected from mask 46. The following table represents characteristics of holographic optical element 24, including monochromator 30, pinholes 26 and 28, and zone plate 42:

TABLE II

| Zone plate/grating to pinhole distance | 20 μm |
| --- | --- |
| Size of entrance pinhole 26 | 20 μm |
| Size of exit pinhole 28 | 20 μm |
| Monochromator 30 resolution | 500 |
| Grating pitch | 0.135 μm |
| Grating carrier angle | 5.730 deg. |
| Z offset to exit slit | 99.5 mm |
| X offset to exit slit | 9.983 mm |
| Zone plate/grating size | 9 mm |
| Zone plate resolution | 80 nm |

Consequently, CCD 50 serves as a detector for revealing any defects on surface 44 of mask 46. Such defects may appear as dark spots or other anomalies on a screen associated with CCD 50. Charge coupled device 50 may take the form of a vacuum cooled CCD manufactured by General Electric Co. of Schenectady, New York and distributed under the designation Great Eyes GE-VAC In-Vacuum Camera, having a pixel pitch range of: 13 μm×13 μm-26 μm×26 μm and a readout noise of 5.2-97e-rms. Such CCD 50 possesses 1500× magnification evidenced by 8.7 nm pixels on mask 46.

While in the foregoing embodiments of the application have been set forth in considerable detail for the purposes of making a complete disclosure of the application it may be apparent to those of skill in the art that numerous changes may be made in such details without departing from the spirit and principles of the application.

What is claimed is:

1. An EUV microscope device for analyzing mask defects, comprising:
   a source of a beam of EUV light;
   a collector for said beam of EUV light, said collector providing a first focused EUV beam;
   a monochromator, said monochromator receiving said first focused EUV beam to produce a second EUV beam of a certain focus and linear dispersion;
   an illumination module, said illumination module receiving said second EUV beam from said monochromator and producing a reimaged EUV beam, said reimaged EUV beam being directed to the mask for reflection therefrom;
   a zone plate, said zone plate including a central obscuration, said zone plate receiving said EUV beam reflected from the mask and passing a certain order of said reflected EUV beam; and
   a detector for receiving said certain order of reflected EUV beam and producing an image thereof.

2. The device of claim 1 which additionally comprises an entrance pinhole for intercepting said EUV beam from said collector and passing said EUV beam to said monochromator.

3. The device of claim 2 which additionally comprises an exit pinhole for intercepting said second EUV beam from said monochromator and passing the same to said illumination module.

4. The device of claim 1 in which said illumination module comprises a flat mirror in series with an aspherical mirror.

5. The device of claim 1 in which said collector comprises a flat mirror in series with an aspherical mirror.

6. The device of claim 5 in which said illumination module comprises a flat mirror in series with an aspherical mirror.

7. The device of claim 6 which additionally comprises an entrance pinhole for intercepting said EUV beam from said collector and for passing said EUV beam to said monochromator.

8. The device of claim 7 which additionally comprises an exit pinhole for intercepting said second EUV beam from said monochromator and for passing said EUV beam to said illumination module.

9. The device of claim 1 in which said source of said beam of EUV light comprises the generation of a laser produced plasma.

10. The device of claim 1 in which said source of a beam of EUV light comprises a discharge produced plasma.

\* \* \* \* \*